United States Patent [19]
Soyano et al.

[11] Patent Number: 5,519,252
[45] Date of Patent: May 21, 1996

[54] POWER SEMICONDUCTOR DEVICE EMPLOYING PIN BLOCK CONNECTION ARRANGEMENT FOR FACILITATED AND ECONOMIZED MANUFACTURE

[75] Inventors: Shin Soyano; Susumu Toba, both of Kanagawa, Japan

[73] Assignee: Fuji Electric Co., Ltd., Kanagawa, Japan

[21] Appl. No.: 361,155

[22] Filed: Dec. 21, 1994

Related U.S. Application Data

[63] Continuation of Ser. No. 79,406, Jun. 21, 1993, abandoned.

[30] Foreign Application Priority Data

Jul. 24, 1992 [JP] Japan .................................. 4-197331

[51] Int. Cl.⁶ ........................... H01L 23/48; H01L 23/52
[52] U.S. Cl. .................... 257/690; 257/678; 257/687; 257/691; 257/177; 361/728; 361/823
[58] Field of Search .................................. 257/678, 687, 257/690, 691, 698, 697, 177; 301/728, 772, 809, 823; 363/56, 53

[56] References Cited

U.S. PATENT DOCUMENTS

| | | | |
|---|---|---|---|
| 3,444,440 | 5/1969 | Bell et al. | 257/666 |
| 3,784,725 | 1/1974 | Perkins et al. | 257/687 |
| 4,639,759 | 1/1987 | Neidig et al. | 257/687 |
| 4,731,644 | 3/1988 | Neidig | 257/687 |
| 4,884,126 | 11/1989 | Harada et al. | 257/687 |
| 4,916,502 | 4/1990 | Oshima | 257/687 |
| 4,920,405 | 4/1990 | Inoh et al. | 257/687 |
| 4,965,710 | 10/1990 | Pelly et al. | 363/56 |
| 5,172,215 | 12/1992 | Kobayashi et al. | 257/687 |

FOREIGN PATENT DOCUMENTS

| | | | |
|---|---|---|---|
| 0098028A3 | 1/1984 | European Pat. Off. . | |
| 0516149A1 | 12/1992 | European Pat. Off. . | |
| 3505086 | 8/1986 | Germany | 257/687 |
| 0005549 | 1/1988 | Japan | 257/687 |
| 0081461 | 3/1990 | Japan | 257/687 |

OTHER PUBLICATIONS

Japanese Abstract of JP 62–016554, published Jan. 24, 1987.
Japanese Abstract of JP 63–098140, published Apr. 28, 1988.

*Primary Examiner*—Rolf Hille
*Assistant Examiner*—David Ostrawski
*Attorney, Agent, or Firm*—Finnegan, Henderson, Farabow, Garrett & Dunner

[57] ABSTRACT

In a power semiconductor device having a power circuit 1 and a control circuit 2 incorporated in a resin case 4, said circuits being mounted on different substrates 1a and 2a and interconnected internally, and power terminals 6 and control terminals 7 connected to the power and control circuits, respectively, being drawn out of the case, the power terminals 6, the control terminals 7 and lead pins 13 are preliminarily molded by an insert technique together with the case as the power terminals 6 and the control terminals 7 are arranged at the peripheral edge of the case 4 whereas the lead pins 13 for establishing interconnection between the power and control circuits are arranged on a pin block 12 provided at the middle stage within the case, and the substrate 1a for the power circuit is mounted on a heat dissipating metal base 11 combined with the bottom side of the case 4 and the substrate 2a for the control circuit on the pin block 12, with the power terminals, control terminals and the pin block being soldered together to assemble the power semiconductor device.

3 Claims, 2 Drawing Sheets

POWER SEMICONDUCTOR DEVICE EMPLOYING PIN BLOCK CONNECTION ARRANGEMENT FOR FACILITATED AND ECONOMIZED MANUFACTURE

This application is a continuation, of application Ser. No. 08/079,406 filed Jun. 21, 1993, now abandoned.

BACKGROUND OF THE INVENTION

1. Field of the Invention

The present invention relates to an assembly structure of power semiconductor device that is to be implemented for power transistors, thyristors, diode modules, etc.

2. Description of Prior Art

A conventional assembly structure of power semiconductor device is shown in FIG. 4. Reference numeral 1 is a power circuit comprising a heat radiating aluminum insulated substrate 1a that has a power semiconductor element 1b mounted thereon; 2 is a control circuit comprising a printed-wiring board 2a that has circuit components 2b mounted thereon; 3 is a flexible substrate interconnecting the power circuit 1 and the control circuit 2; 4 is a resin case in which the power circuit 1 and the control circuit 2 are incorporated; 5 is the lid of the case; 6 and 7 are power terminals of a frame type and control terminals of a fast pin type, respectively, that are drawn out of the case 4 via drawing pockets formed on its peripheral edge; 8 is a molding resin (epoxy resin) with which the power terminals 6 and the control terminals 7 are secured in the case 1; and 9 is a gel of sealing resin (silicone gel) with which the case is filled.

The semiconductor device having the structure shown in FIG. 4 is assembled by the following procedure. First, the power element 1b and the power terminals 6 are mounted and soldered onto the aluminum insulated substrate 1a. Further, the flexible substrate 3 for establishing interconnection with the control circuit 2, as well as the control terminals 7 are mounted and soldered onto the aluminum insulated substrate 1a. Subsequently, the case 4 is mounted and adhered onto the aluminum insulated substrate 1a and, thereafter, the sealing resin 9 is injected into the case 4 through the opening in the top, followed by filing the terminal drawing areas with the molding resin 8, which is then cured. Thereafter, the lid 5 is placed on top of the case 4, terminal nuts 10 are fitted in the case 4 and, finally, the drawing ends of the power terminals 6 are bent in such a way that they are placed over and in registry with the nuts 10.

The conventional assembly structure above described have the following problems with respect to the process of assembly, the quality of the final product, and its cost.

(1) It is necessary in the assembly process to retain the power and control terminals in predetermined attitudes when they are soldered. At subsequent stages, the molding resin 8 and the sealing resin 9 are injected and cured in the case 4 in separate steps and, furthermore, the terminal nuts 10 must be inserted and the power terminals 6 bent, increasing the total number of steps involved in the assembly process while reducing its operating efficiency.

(2) Since the power terminals 6 and the control terminals 7 are to be secured in the case 4 by means of the molding resin 8, the drawout positions of the terminals will be offset on account of the shrinkage that occurs upon resin curing, whereby the positional precision of the terminals drops. Consequently, defects will occur as exemplified by difficulty in the process of bending the leads from the power terminals 6 (the holes in the terminals will not be in registry with the positions of the terminal nuts) and by the failure of the control terminals 7 of a fast pin type to align correctly in a row, causing difficulty in the subsequent handling (connecting leads to an external circuit).

(3). The flexible substrate 3 interconnecting the power circuit 1 and the control circuit 2 is expensive and, furthermore, a sophisticated assembling technique is required in connecting the flexible substrate to each circuit; hence, the final product will become too costly to be used commercially.

SUMMARY OF THE INVENTION

The present invention has been accomplished under these circumstances and has as an object providing a power semiconductor device that can be fabricated at low cost and which insures high reliability.

This object of the present invention can be attained by a power semiconductor device characterized in that the power terminals, control terminals and internal wiring lead pins for interconnecting the power and control circuits are molded by an inset technique together with the case as they are arranged in predetermined positions, and the power and control circuits incorporated in said case being soldered to assemble the power semiconductor circuit.

According to the invention, molding is performed by an insert technique with the power and control terminals being interspersed on the periphery of the case and the lead pins on a beam-shaped pin block formed at the middle stage within the case, and the substrate for the power circuit being mounted on a heat dissipating metal base combined with the bottom side of the case and the substrate for the control circuit on said pin block, with the power terminals, control terminals and the pin block being soldered together to assemble the power semiconductor device.

Further, the pin block can be separated from the body of the case and incorporated in such a way that it is movable up and down.

Furthermore, a DBC substrate or an aluminum insulated substrate is used as the substrate for the power circuit.

To fabricate the power semiconductor device of the present invention, components such as the power terminals, control terminals and the lead pins are molded together with the resin case, as they are inserted in a mold, in a separate molding step from that of assembling the product. Before the case molding step, the power terminals are bent independently of other components and, at the same time, the terminal nuts accessory to said power terminals are molded by an insert technique. Hence, in the step of assembling the semiconductor device, all that is needed to complete the assembling of the principal components is to incorporate the power and control circuits in the case and join between the power terminals, control terminals and the lead pins by soldering. A particular advantage is that there is no need to support the attitudes of the power and control terminals while they are soldered to the power and control circuits, respectively. Furthermore, the need for the steps of injecting and curing the resin in order to fix the power and control terminals in the case, as well as the need for a complex operation of connecting the flexible substrate to each of the power and control circuits are eliminated; in addition, the positional precision of drawing the power and control terminals is insured.

If desired, a pin block having the lead pins embedded in the surface may be separated from the body of the case and mounted in such a way that it is movable up and down. This structure offers the advantage that if, when the power circuit is incorporated in the case, the distal ends of the lead pins contact the substrate for the power circuit, the pin block will escape upward and said substrate will no longer be subjected to excessive stress; as a result, a ceramic substrate such as a DBC substrate can be effectively used as the substrate for the power circuit without experiencing a serious trouble such as cracking.

DETAILED DESCRIPTION OF PREFERRED EMBODIMENTS

Figure 3:
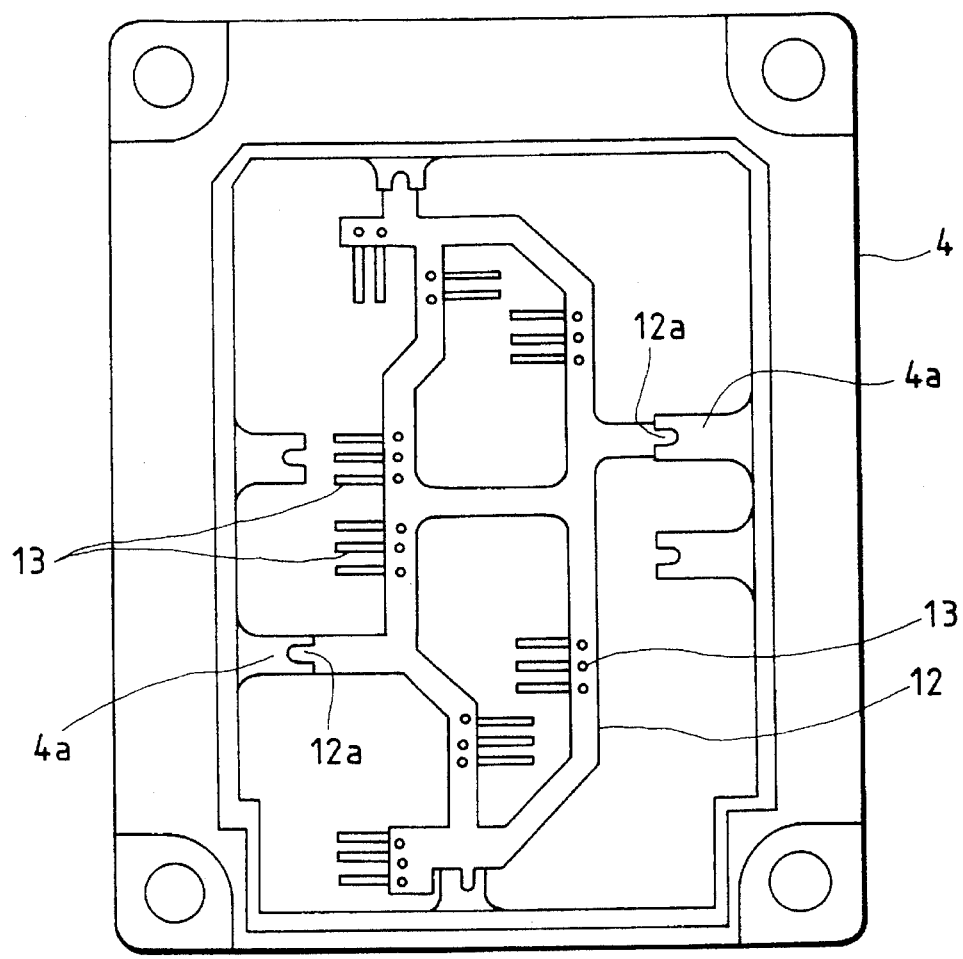
FIG. 3 is a plan view showing how the pin block appearing in FIG. 1 is mounted.
Figure 4:
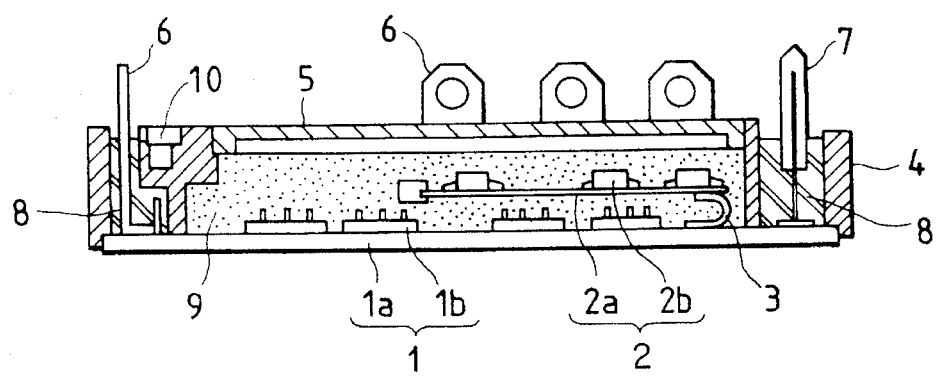
FIG. 4 is a cross-sectional view showing a prior art assembly structure of a power semiconductor device.

An embodiment of the present invention is described below with reference to FIGS. 1 to 3, in which the same members as those shown in FIG. 4 are identified by same numerals.

Figure 1:
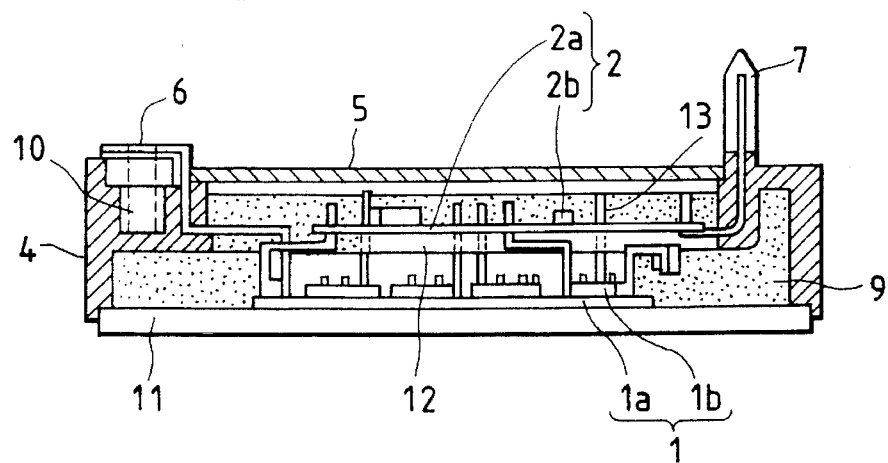
FIG. 1 is cross-sectional view showing an assembly structure of a power semiconductor device according to an embodiment of the present invention.
Figure 2:
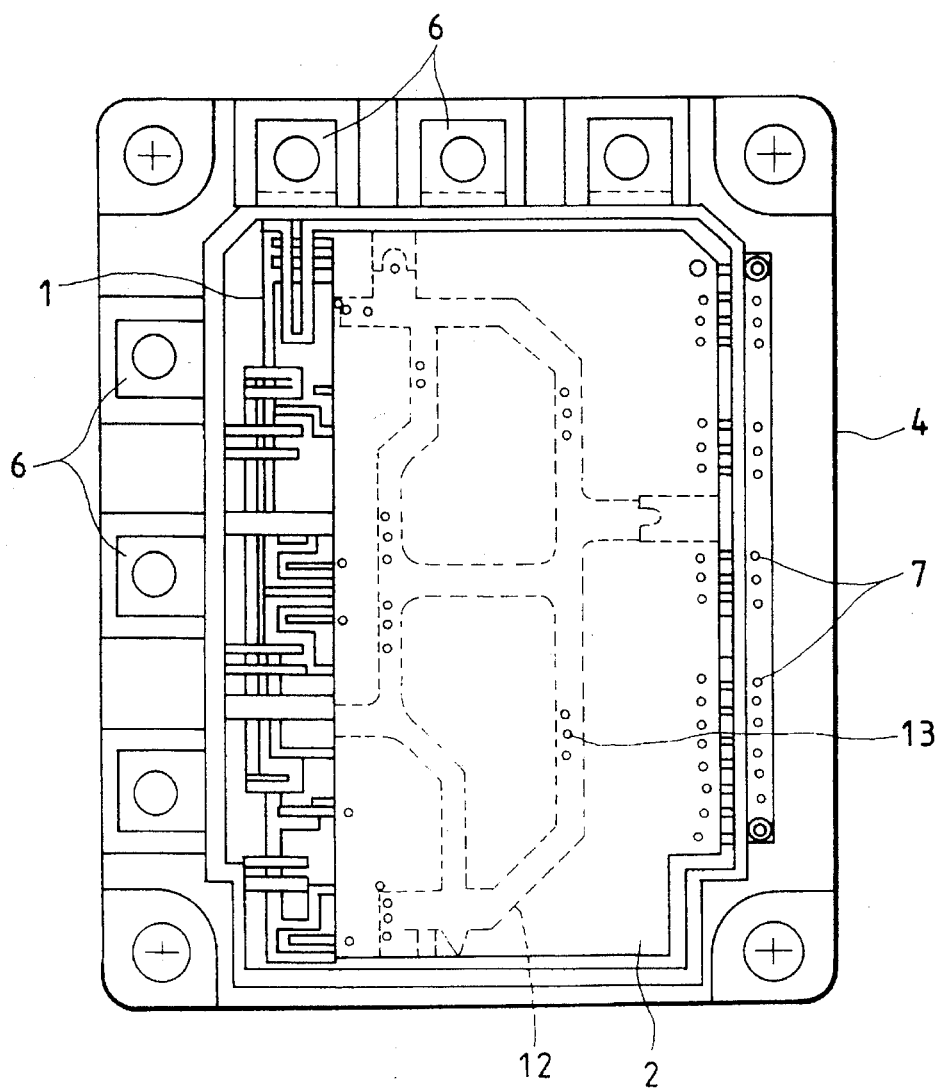
FIG. 2 is plan view of FIG. 1 with the lid of the case removed.

In each of FIGS. 1 to 3, the resin case indicated by 4 combines with a heat radiating metal base 11 on the bottom side to compose a package. The substrate 1a forming part of the power circuit 1 is in the form of a DBC (direct bonding copper) or aluminum insulated substrate that is carried on the metal base 11. Power terminals 6 and control terminals 7 are molded by an insert technique together with the case 4 as they are arranged at the peripheral edge of the case; at the same time, a beam-shaped pin block 12 is provided in a rib pattern at the middle stage within the case and lead pins 13 that establish internal wiring between the power circuit 1 and the control circuit 2 are embedded, as interspersed, in the surface of the pin block in predetermined positions.

In the embodiment shown, the pin block 12 is separated from the body of the case and, as shown in FIG. 3, the pin block 12 is supported vertically movable as mounting legs 12a which are part of the pin block are loosely fitted with respect to mounting seats 4a protruding from the inside surface of the case body. In this case, geometrical factors such as the shape of the pin block 12 and the positions of mounting legs 13a are designed in correspondence with the arrangement of the lead pins 13. Although not shown, another possible structure is such that the pin block 12 is preliminarily molded as an integral part of the case 4.

The substrate 2a for the control circuit (printed-wiring board) is mounted above the pin block 12 in such a way that the control circuit 2 is at the upper stage in the case 4 whereas the power circuit 1 is at the lower stage. In this semiassembled state, the power circuit 1 is soldered to the power terminals 6, the control circuit 2 to the control terminals 7, and the power circuit 1 to the control circuit 2 via the lead pins 13.

The process for fabricating the resin case, as well as the procedure of assembling the semiconductor device are described below. To begin with, the process of fabricating the resin case 4 starts with inserting the necessary components, such as power terminals 6 preliminarily bent in a predetermined shape, control terminals 7, lead pins 13 and nuts 10 for the power terminals, in a mold as they are arranged in predetermined positions. With the inserted components held in that way, the molding resin is injected into the mold to form the case 4. In a structure where the pin block 12 is made separated from the body of the case 4, the block is molded in a separate step from that of molding the case. In this way, a case integral with the power and control terminals and the lead pins is composed.

The procedure of assembling the semiconductor device starts with mounting the substrate 1a for the power circuit 1 on the metal base 11 by soldering. Then, the case 4 is fitted over the metal base 11 and bonded to the latter. With the necessary components held in this state, the power circuit 1 is soldered not only to the power terminals 6 but also to the lead pins 13 embedded in the surface of the pin block 12. Subsequently, the control circuit 2 is inserted from above the case 4 in such a way that the substrate 2a is located on the pin block 12; in this semi-assembled state, the control circuit 2 is soldered not only to the control terminals 7 but also to the lead pins 13. Then, the sealing resin (silicone gel) 9 is injected into the case 4 and cured; finally, the case 4 is closed with the lid 5 to yield the complete product.

Being composed by the assembling procedure described on the foregoing pages, the power semiconductor device of the present invention offers the following advantages;

Since components such as power terminals, control terminals and lead pins that establish interconnection between a power and a control circuit are preliminarily molded by an insert technique together with the case, it is no longer necessary in the process of assembling the semiconductor device to perform complex or additional steps that have heretofore been essential to the prior art structures, such as maintaining the attitudes of the power and control terminals throughout the soldering stage, providing a flexible substrate for establishing interconnection between the power and control circuits, connecting said substrate to both circuits (which is quite cumbersome to achieve) and injecting and curing the resin for securing the terminal drawing portions to the case; as a result, not only it is possible to reduce the number of steps involved in the process of assembly and improve the operating efficiency but also the manufacturing cost of the power semiconductor device as the final product is drastically reduced.

Since external leadout terminals such as the power and control terminals are molded by an insert technique together with the case, high positional precision is insured with respect to the positions at which the respective terminals are drawn out of the case.

Particularly in the case where the lead pins are inserted in the pin block that is provided at the middle stage within the case and which is separated from the body of the case and incorporated in such a way that it is movable up and down, the ramming load of lead pins that is exerted upon the substrate for the power circuit, say, a DBC substrate as the power circuit is incorporated within the case is relaxed sufficiently to assure safety by avoiding the occurrence of serious troubles such as cracking of the ceramic substrate.

Because of the advantages described above, the present invention provides a power semiconductor device of high quality and reliability at low cost.

What is claimed is:

1. A power semiconductor device comprising:

a package with a base and a resin case with power and control terminals integrally embedded therein;

a power circuit substrate disposed on the base having power circuit means connected to the power terminals;

a pin block made of resin disposed relative to a periphery of the resin case and over the power circuit substrate and having connectors extending therethrough;

a control circuit substrate mounted over the pin block and having control circuit means connected to the control terminals and connected to the power circuit means through the pin block connectors;

a sealing resin disposed within the resin case and about the power and control circuit substrates and the pin block; and a cover disposed on the resin case.

2. A power semiconductor device as claimed in claim 1, wherein said pin block is separate from said resin case.

3. A power semiconductor device as claimed in claim 1, wherein said pin block is in a form of a beam.

* * * * *